United States Patent
Lee et al.

(10) Patent No.: US 8,158,469 B2
(45) Date of Patent: Apr. 17, 2012

(54) METHOD OF FABRICATING ARRAY SUBSTRATE

(75) Inventors: Hong-Koo Lee, Goyang-si (KR); Sung-Ki Kim, Seoul (KR); Jun-Hyeon Bae, Seoul (KR); Ki-Tae Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 158 days.

(21) Appl. No.: 12/843,738

(22) Filed: Jul. 26, 2010

(65) Prior Publication Data

US 2011/0124162 A1 May 26, 2011

(30) Foreign Application Priority Data

Nov. 20, 2009 (KR) .......................... 10-2009-0112565

(51) Int. Cl.
*H01L 21/84* (2006.01)
(52) U.S. Cl. .. 438/158; 438/159; 438/166; 257/E21.414
(58) Field of Classification Search .................. 438/158, 438/159, 149, 166, 151; 257/E21.414
See application file for complete search history.

(56) References Cited

U.S. PATENT DOCUMENTS

| | | | | |
|---|---|---|---|---|
| 5,478,766 A | * | 12/1995 | Park et al. | 438/158 |
| 7,374,979 B2 | * | 5/2008 | Seo et al. | 438/151 |
| 7,785,992 B2 | * | 8/2010 | Kim et al. | 438/487 |
| 8,021,937 B2 | * | 9/2011 | Roh et al. | 438/158 |

\* cited by examiner

*Primary Examiner* — Michael Trinh
(74) *Attorney, Agent, or Firm* — Birch, Stewart, Kolasch & Birch, LLP (57) ABSTRACT

A method of fabricating an array substrate includes forming a gate line and a gate electrode; forming a gate insulating layer, an intrinsic amorphous silicon layer, an inorganic material insulating layer and a heat transfer layer on the gate line and the gate electrode; irradiating a laser beam onto the heat transfer layer to crystallize the intrinsic amorphous silicon layer into a polycrystalline silicon layer; removing the heat transfer layer; patterning the inorganic insulating material layer using a buffered oxide etchant to form an etch-stopper corresponding to the gate electrode forming an impurity-doped amorphous silicon layer and a metal layer on the etch-stopper and the polycrystalline silicon layer; patterning the metal layer to form a data line, a source electrode and a drain electrode and forming a pixel electrode on the passivation layer.

9 Claims, 12 Drawing Sheets

FIG. 3E
BOE etching process

FIG. 3F

FIG. 3G
BOE cleaning process

FIG. 4F
BOE over-etching process

METHOD OF FABRICATING ARRAY SUBSTRATE

The present application claims the benefit of Korean Patent Application No. 10-2009-0112565, filed in Korea on Nov. 20, 2009, which is hereby incorporated by reference.

BACKGROUND OF THE INVENTION

1. Field of the Invention

The present invention relates to an array substrate, and more particularly, to a method of fabricating an array substrate that includes a thin film transistor having excellent properties.

2. Discussion of the Related Art

As the society has entered in earnest upon an information age, a field of display devices that represent all sorts of electrical signals as visual images has developed rapidly. Particularly, the liquid crystal display (LCD) device or the OELD device as a flat panel display device having characteristics of light weight, thinness and low power consumption is developed to be used as a substitute for a display device of cathode-ray tube type.

Since the LCD device including a thin film transistor (TFT) as a switching element, referred to as an active matrix LCD (AM-LCD) device, has excellent characteristics of high resolution and displaying moving images, the AM-LCD device has been widely used.

On the other hand, since the OELD device has excellent characteristics of high brightness, a low power consumption and high contrast ratio, the OELD device has been widely used. Moreover, the OELD device has advantages of a high response rate, a low production cost and so on.

Both the LCD device and the OELD device require an array substrate including a thin film transistor (TFT) as a switching element for controlling on and off of each pixel region. In addition, the OELD device requires another TFT as a driving element for driving an organic electroluminescent diode in each pixel region. For example, in the LCD device, the TFT as a switching element is connected to a gate line and a data line. The TFT is controlled to provide a signal into a pixel region.

Figure 1:
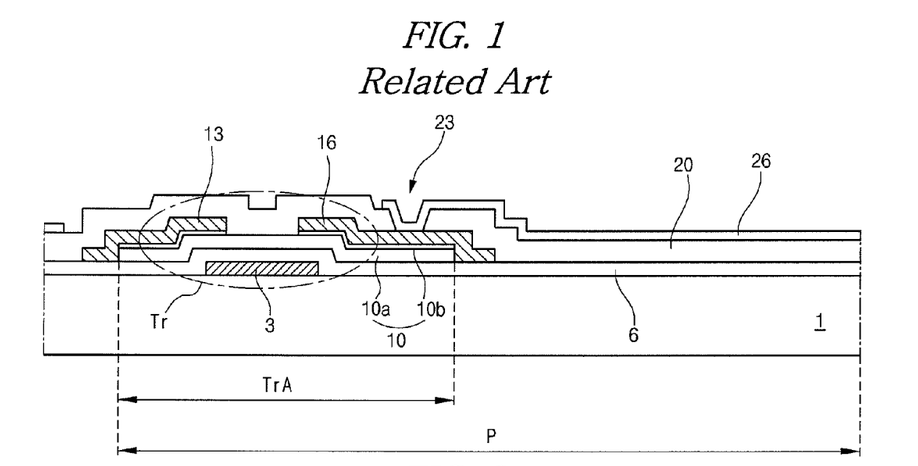
FIG. 1 is a cross-sectional view of a portion of the related art array substrate for the OELD device.

FIG. 1 is a cross-sectional view of a portion of the related art array substrate. In FIG. 1, the array substrate includes a substrate 1 including a pixel region P and the switching region TrA in the pixel region P. On the substrate 1, a gate electrode 3 is disposed in the switching region TrA, and a gate insulating layer 6 covers the gate electrode 3. A semiconductor layer 10 including an active layer 10a and an ohmic contact layer 10b is disposed on the gate insulating layer 6 and in the switching region TrA. The active layer 10a is formed of intrinsic amorphous silicon, and the ohmic contact layer 10b is formed of impurity-doped amorphous silicon. A source electrode 13 and a drain electrode 16, which are spaced apart from each other, are disposed on the semiconductor layer 10. A portion of the ohmic contact layer 10b corresponding to a space between the source and drain electrodes 13 and 16 is removed such that a center of the active layer 10a is exposed through the space between the source and drain electrodes 13 and 16. The gate electrode 3, the gate insulating layer 6, the semiconductor layer 10, the source electrode 13 and the drain electrode 16 constitute the TFT Tr.

A passivation layer 20 including a drain contact hole 23 is formed on the TFT Tr. The drain contact hole 23 exposes the drain electrode 16 of the TFT Tr. A pixel electrode 26 contacting the drain electrode 16 of the TFT Tr is formed on the passivation layer 20 and in each pixel region P.

Although not shown, a gate line, which is connected to the gate electrode 3, is disposed at the same layer as the gate electrode 3. In addition, a data line, which is connected to the source electrode 13, is disposed at the same layer as the source electrode 13.

The active layer in the related art array substrate in FIG. 1 is formed of intrinsic amorphous silicon. Since atoms of intrinsic amorphous silicon are randomly arranged, they have a metastable state when light is irradiated or an electric field is applied. Accordingly, there is an disadvantage in a use for a switching element or a driving element. In addition, the active layer of intrinsic amorphous silicon has a relatively low carrier mobility, for example, 0.1 to 1.0 cm$^2$/V·s, there is further limitation in a use for a driving element.

To resolve these problems, a fabricating method for the TFT including an active layer of plycrystalline silicon has been introduced. Intrinsic amorphous silicon is crystallized into polycrystalline silicon using an eximer laser annealing (ELA) method.

Figure 2:
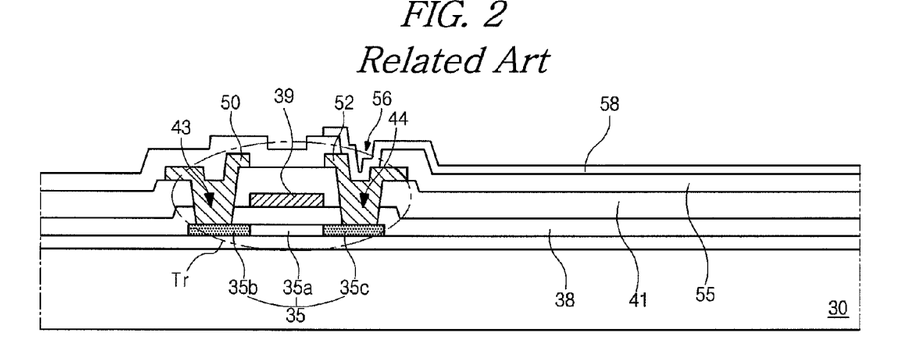
FIG. 2 is a cross-sectional view of the related art array substrate including the active layer of polycrystalline silicon.

FIG. 2 is a cross-sectional view of the related art array substrate including the active layer of polycrystalline silicon. Referring to FIG. 2, a TFT Tr, a passivation layer 55 including a drain contact hole 56 exposing a portion of the TFT Tr and a pixel electrode 58 are formed on a substrate 30. The TFT Tr includes a semiconductor layer 35, which includes an active region 35a, a source region 35b at one side of the active region 35a and a drain region 35c at the other side of the active region 35a, a gate insulating layer 38, a gate electrode 39, an interlayer insulating layer, which includes a first contact hole 43 for exposing the source region 35b and a second contact hole 44 for exposing the drain region 35c, a source electrode 50 contacting the source region 35b through the first contact hole 43 and a drain electrode 52 contacting the drain region 35c through the second contact hole 44.

Since high impurities should be doped into the source and drain regions 35b and 35c of the semiconductor layer 35, the fabricating method for the array substrate requires an ion implantation apparatus for the doping process. Accordingly, production costs are increased. In addition, since the TFT in FIG. 2 has more complicated structure, production yield is reduced.

SUMMARY OF THE INVENTION

Accordingly, the present invention is directed to a method of fabricating an array substrate that substantially obviates one or more of the problems due to limitations and disadvantages of the related art.

An object of the present invention is to provide a method of fabricating an array substrate including a thin film transistor having improved properties.

Another object of the present invention is to reduce production costs and improve production yield for an array substrate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a method of fabricating an array substrate includes forming a gate line and a gate electrode connected to the gate line; sequentially forming a gate insulating layer, an intrinsic amorphous silicon layer, an inorganic material insulating layer and a heat transfer layer on the gate line and the gate electrode; irradiating a laser beam onto the heat transfer layer to crystallize the intrinsic amorphous silicon layer into a polycrystalline silicon layer; removing the heat transfer layer; patterning the inorganic insulating material layer using a buffered oxide etchant to form an etch-stopper corresponding to the gate electrode, wherein a first process time for the step of patterning the inorganic insulating material layer is longer than a second process time minimally required for completely removing the inorganic insulating material layer; sequentially forming an impurity-doped amorphous silicon layer and a metal layer on the etch-stopper and the polycrystalline silicon layer; patterning the metal layer to form a data line, a source electrode and a drain electrode, the impurity-doped amorphous silicon layer to form an ohmic contact layer, and the polycrystalline silicon layer to form an active layer, the data line crossing the gate line and connected to the source electrode, the drain electrode spaced apart from the source electrode, an end of the source electrode and an end of the drain electrode overlapping the etch-stopper, the ohmic contact layer disposed under the source electrode and the drain electrode, and the active layer disposed under the ohmic contact layer and the etch-stopper; forming a passivation layer on the data line, the source electrode and the drain electrode and including a drain contact hole exposing a portion of the drain electrode; and forming a pixel electrode on the passivation layer and contacting the portion of the drain electrode through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

FIG. 3A to 3M are cross-sectional views of a fabricating process of an array substrate according to a first embodiment of the present invention. For convenience of explanation, a switching region is defined in a pixel region.

Figure 3A:
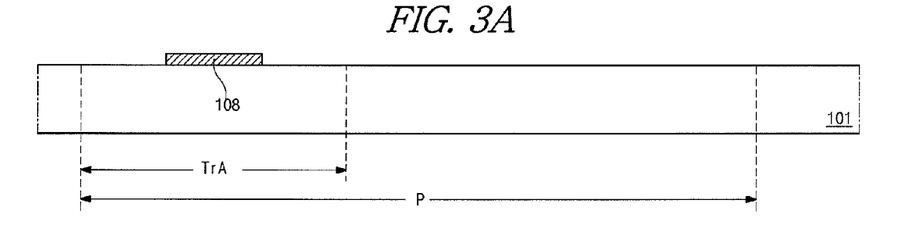
FIGS. 3A to 3M are cross-sectional views of a fabricating process of an array substrate according to a first embodiment of the present invention.

As shown in FIG. 3A, a first metal layer (not shown) is formed on a substrate 101 by depositing a first metallic material. For example, the first metallic material may include one of aluminum (Al), Al alloy (AlNd), copper (Cu), Cu alloy and chromium (Cr). The first metal layer is patterned by a first mask process to form a gate line (not shown) and a gate electrode 108 connected to the gate line. The mask process includes a step of forming a photoresist (PR) layer on the first metal layer, a step of exposing the PR layer using an exposing mask, a step of developing the exposed PR layer to form a PR pattern, a step of etching the first metal layer using the PR pattern as an etching mask and a step of stripping the PR pattern.

FIG. 3A shows the first metal layer having a single-layered structure. Alternatively, the first metal layer may have at least double-layered structure by sequentially depositing at least two of the first metallic material. In this case, each of the gate line and the gate electrode 108 has at least double-layered structure.

Figure 3B:
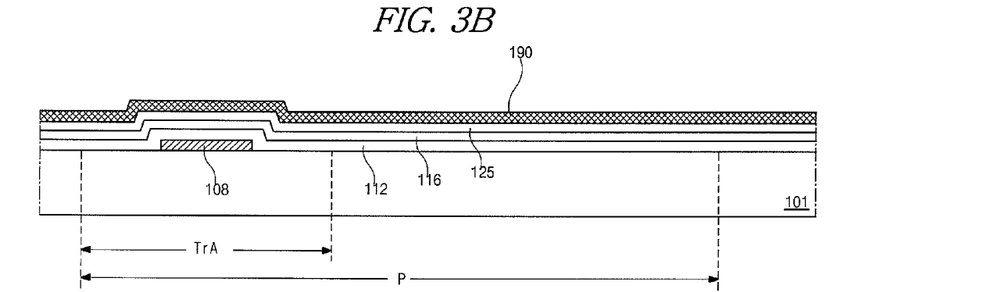

Next, as shown in FIG. 3B, a gate insulating layer 112 is formed on the gate line and the gate electrode 108 by depositing an inorganic insulating material. For example, the inorganic insulating material may include silicon oxide or silicon nitride.

Sequentially, an intrinsic amorphous silicon layer 116, an inorganic insulating material layer 125 and a heat transfer layer 190 are formed on the gate insulating layer 112 by sequentially depositing intrinsic amorphous silicon, an inorganic insulating material and a second metallic material. For example, the inorganic insulating material for the inorganic insulating layer 125 may include silicon oxide or silicon nitride. For example, the second metallic material may include Cr, Cr alloy, titanium (Ti) and Ti alloy. The second metallic material has an excellent property for convert an optical energy of a laser beam into a thermal energy.

Figure 3C:
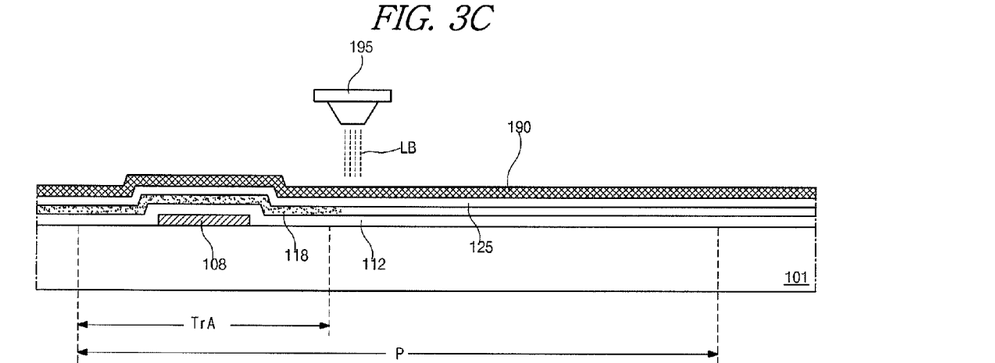

Next, as shown in FIG. 3C, a laser beam LB is irradiated onto the heat transfer layer 190 using a laser beam irradiation apparatus 195 to micro-crystallized the intrinsic amorphous silicon layer 116 (of FIG. 3B). As a result, a polycrystalline silicon layer 118 is formed from the intrinsic amorphous silicon layer 116. The laser beam irradiation apparatus 195 uses a solid phase material as a laser beam source for generating the laser beam. For example, the laser beam irradiation apparatus 195 is a diode pumped solid state (DPSS) laser beam irradiation apparatus. With compared to a laser beam irradiation apparatus using a gate phase material as a laser beam source, the laser beam irradiation apparatus 195 using a solid phase material as a laser beam source has smaller error range of an energy density in a unit area. Accordingly, there is an uniform crystallization with the laser beam irradiation apparatus 195 uses a solid phase material as a laser beam source. The laser beam LB has a wavelength of about 700 to 1300 nm. An energy of the laser beam LB irradiated onto the heat transfer layer 190 is converted into a thermal energy. The thermal energy is uniformly transferred onto the intrinsic amorphous silicon layer 116 through the inorganic insulating material layer 125 such that the polycrystalline silicon layer 118 is formed.

Figure 3D:
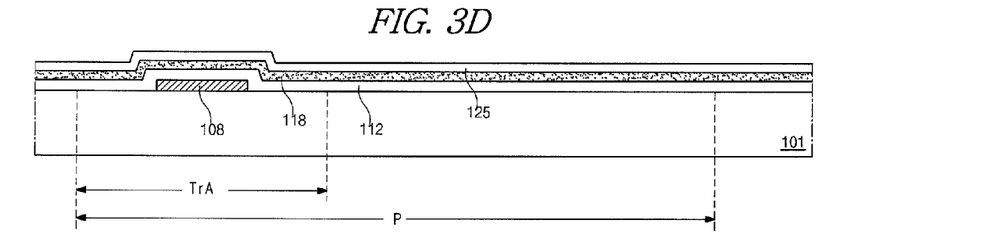

Next, as shown in FIG. 3D, the heat transfer layer 190 (of FIG. 3C) is etched such that the inorganic insulating material layer 125 is exposed.

Figure 3E:
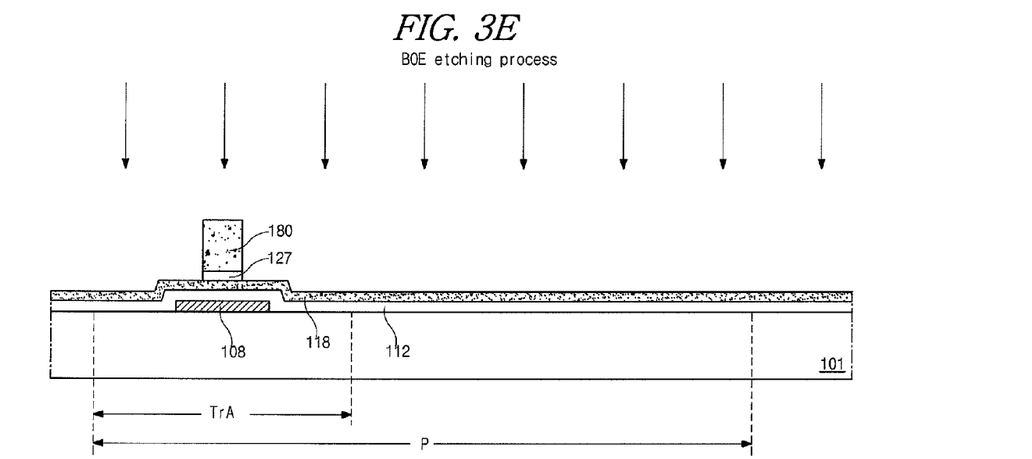

Next, as shown in FIG. 3E, a first PR pattern 180 is formed on the inorganic insulating material layer 125 (of FIG. 3D). The first PR pattern 180 corresponds to a center of the switching region TrA. An etching process using a buffered oxide etchant (BOE) is performed t etch the inorganic insulating material layer 125 using the first PR pattern 180 as an etching mask process. The etching process using the BOE is referred to as a BOE etching process. As a result, an etch-stopper 127 is formed under the first PR pattern 180. The etch-stopper 127 corresponds to the gate electrode 108. Namely, the inorganic insulating material layer 125 is patterned by a second mask process to form the etch-stopper 127 and to expose the polycrystalline silicon layer 118. The first PR pattern 180 is removed.

Figure 3F:
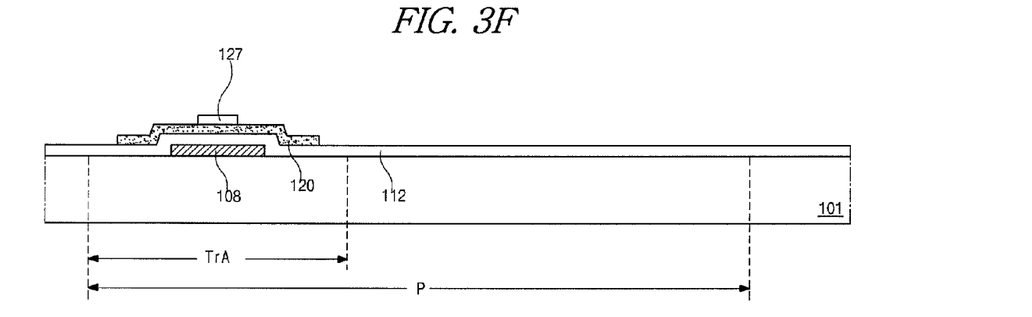

Next, as shown in FIG. 3F, the polycrystalline silicon layer 118 (of FIG. 3E) is patterned by a third mask process to form an active layer 120 in the switching region TrA and to expose the gate insulating layer 112. The active layer 120 is formed of polycrystalline silicon and has an island shape.

Figure 3G:
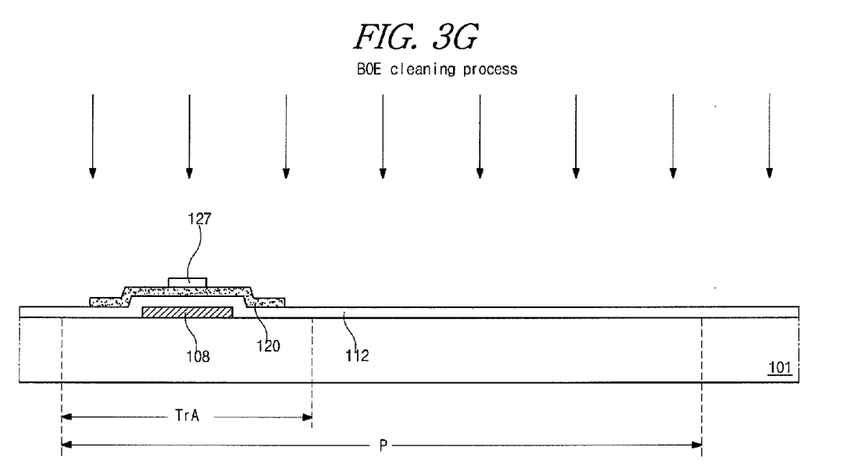

Next, as shown in FIG. 3G, a cleaning process using the BOE is performed onto the active layer 120 and the gate insulating layer 112. The cleaning process is referred to as a BOE cleaning process. Since the active layer 120 is exposed to air after the step of forming the active layer 120 and before the cleaning process, an oxidation layer (not shown) is spontaneously formed on the active layer 120. The oxidation layer is removed by the BOE cleaning process. If an ohmic contact layer 131 (of FIG. 3L) is formed on the active layer 120 without removing the oxidation layer, an ohmic contact property is degraded by the oxidation layer such that properties of the TFT Tr is also degraded. In addition, impurity-doped amorphous silicon is deposited without removing the oxidation layer, micro bubbles are generated on a surface of the active layer 120. This problem may be referred to as a micro peeling problem. Accordingly, the BOE cleaning process for removing the oxidation layer is performed.

Figure 3H:
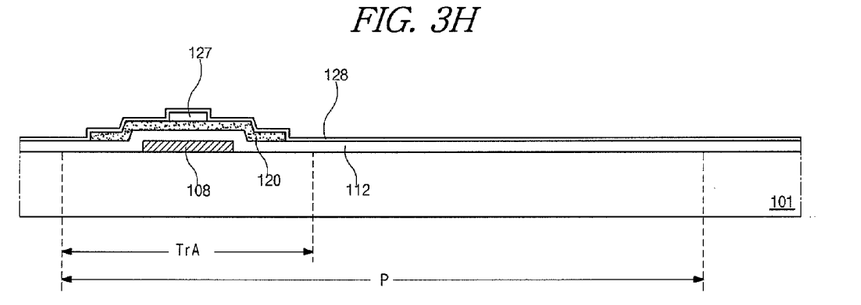

Next, as shown in FIG. 3H, after the BOE cleaning process, an impurity-doped amorphous silicon layer 128 is formed on the etch-stopper 127, the active layer 120 and the gate insulating layer 112 by depositing impurity-doped amorphous silicon. Since the oxidation layer 120 is removed by the BOE cleaning process, the impurity-doped amorphous silicon layer 128 has ah ohmic contact with the active layer 120.

Figure 3I:
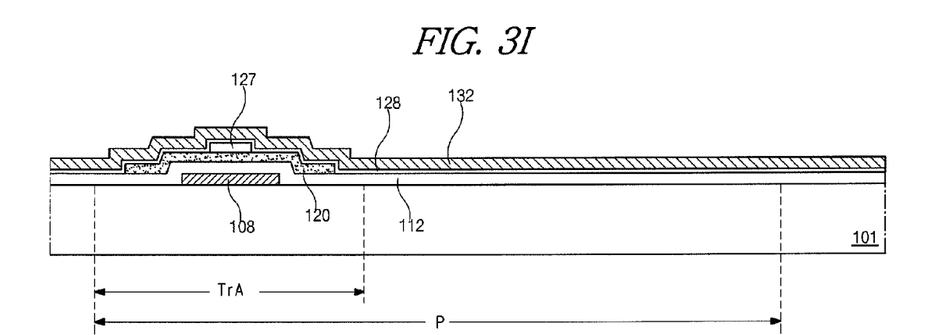

Next, as shown in FIG. 3I, a second metal layer 132 is formed on the impurity-doped amorphous silicon layer 128 by depositing a third metallic material. For example, the third metallic material may include one of molybdenum (Mo), Mo—Ti alloy (MoTi), Al, Al alloy (AlNd), Cu and Cu alloy.

Figure 3J:
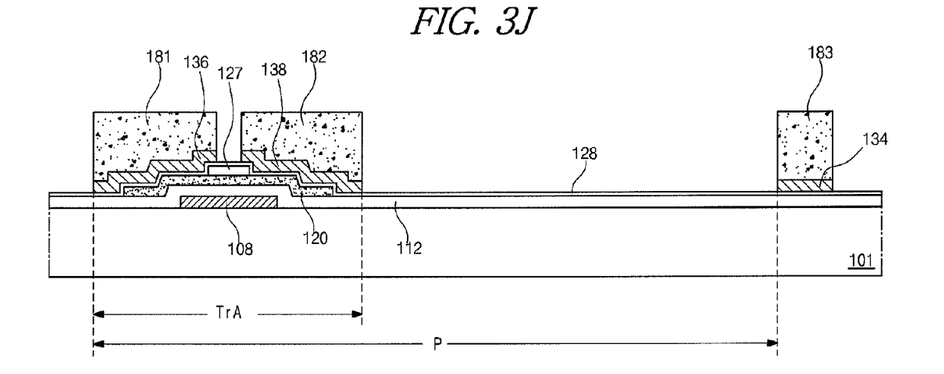

Next, as shown in FIG. 3J, a PR layer (not shown) is formed on the second metal layer 132 (of FIG. 3I). The PR layer is exposed and developed to form second to fourth PR patterns 181, 182 and 183 on the second metal layer 132. The second PR pattern 181 is posited at one side of the etch-stopper 127, and the third PR pattern 182 is disposed at the other one side of the etch-stopper 127. The third PR pattern 182 is spaced apart from the second PR pattern 181. The fourth PR pattern 183 is disposed at one edge of the pixel region P. The fourth PR pattern 183 extends from the second PR pattern 181.

The second metal layer 132 is etched using the second to fourth PR patterns 181, 182 and 183 to form a source electrode 136 under the second PR pattern 181, a drain electrode 138 under the third PR pattern 182 and a data line 134 under the fourth PR pattern 183 and to expose the impurity-doped amorphous silicon layer 128. The drain electrode 138 is spaced apart from the source electrode 136 such that a portion of the impurity-doped amorphous silicon layer 128 is exposed through a space between the source and drain electrodes 136 and 138, and the data line 134 extends from the source electrode 136. An end of the source electrode 136 and an end of the drain electrode 138 respectively overlaps the etch-stopper 127. Namely, the data line 134 is connected to the source electrode 136. The data line 134 crosses the gate line (not shown) to define the pixel region P.

Figure 3K:
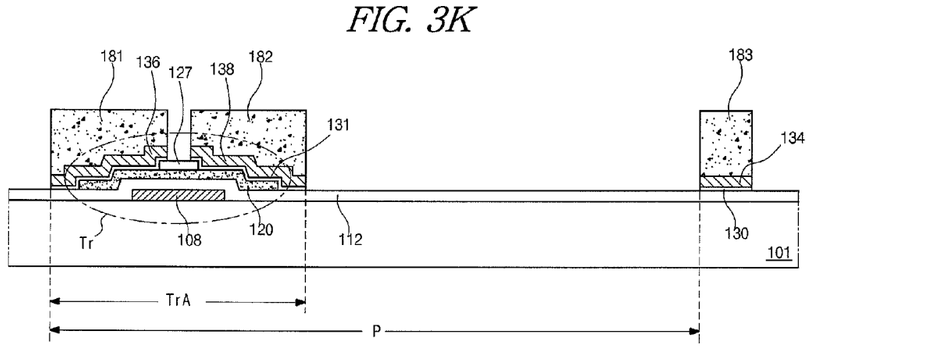

Next, as shown in FIG. 3K, the exposed portions of the impurity-doped amorphous silicon layer 128 (of FIG. 3J) are removed by a dry-etching. Namely, the exposed portion of impurity-doped amorphous silicon layer 128 through the space between the source and drain electrodes 136 and 138 is removed such that the etch-stopper 127 is exposed through the space between the source and drain electrodes 136 and 138. An ohmic contact layer 131 is formed under the source and drain electrodes 136 and 138. Namely, the ohmic contact layer 131 is formed of impurity-doped amorphous silicon. In addition, a dummy pattern 130 from the impurity-doped amorphous silicon layer 128 is formed under the data line 134.

Referring to FIGS. 3H to 3K, the source electrode 136, the drain electrode 138, the data line 134 and the ohmic contact layer 131 are formed by a fourth mask process. The gate electrode 108, the gate insulating layer 112, the active layer 120 of polycrystalline silicon, the etch-stopper 127, the ohmic contact layer 131 of impurity-doped amorphous silicon, the source electrode 136, the drain electrode 138 constitute a TFT Tr.

Figure 3L:
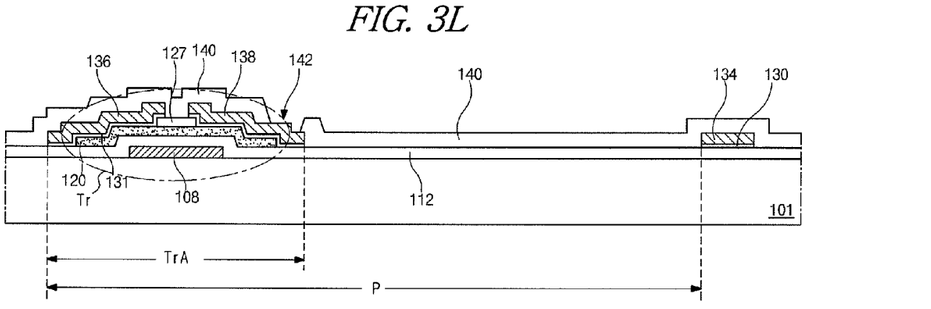

Next, as shown in FIG. 3L, the second to fourth PR patterns 181, 182 and 183 are removed by a stripping process. Then, a passivation layer 140 is formed on the TFT Tr, the data line 134 and the gate insulating layer 112 by coating an organic insulating material or depositing an inorganic insulating material. For example, the organic insulating material may include benzocyclobutene (BCB) or photo-acryl, and the inorganic insulating material may include silicon oxide or silicon nitride. The passivation layer 140 is patterned by a fifth mask process to form a drain contact hole 142. A portion of the drain electrode 138 is exposed through the drain contact hole 142.

Figure 3M:
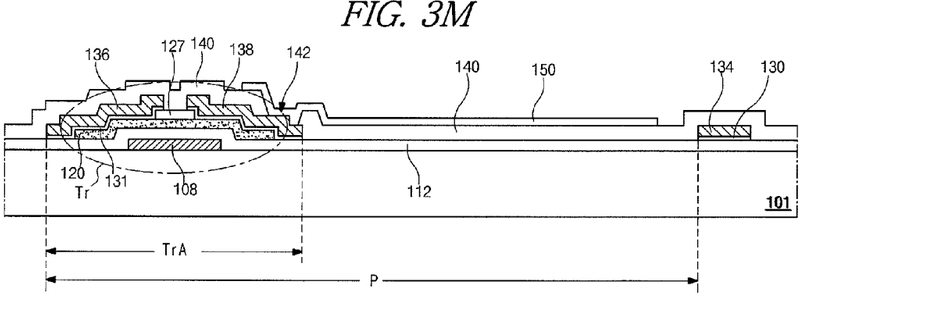

Next, as shown in FIG. 3M, a transparent conductive material layer (not shown) is formed on the passivation layer 140 by depositing a transparent conductive material. For example, the transparent conductive material may include indium-tin-oxide (ITO) or indium-zinc-oxide (IZO). The transparent conductive material layer is patterned by a sixth mask process to form a pixel electrode 150 in the pixel region P. The pixel electrode 150 is disposed on the passivation layer 140 and is connected to the drain electrode 138 through the drain contact hole 142. By the above process, the array substrate according to the first embodiment of the present invention is obtained.

The array substrate according to the first embodiment, since the active layer 120 is formed of polycrystalline silicon, the TFT Tr has improved properties. In addition, since the oxidation layer is removed by the BOE cleaning process, an ohmic contact between the ohmic contact layer 131 and the active layer 120 is improved. Furthermore, since the active layer 120 is covered with the etch-stopper 127 when the ohmic contact layer 131 is formed, there is no damage on the active layer 120.

On the other hand, the gate insulating layer 112 is exposed to the BOE etching process for forming the etch-stopper 127 and the BOE cleaning process for removing the oxidation layer. When the gate insulating layer 112 is formed of an inorganic insulating material, particularly silicon oxide, the BOE is diffused into the gate insulating layer 112 such that pores may be generated in the gate insulating layer at edges of the gate electrode 108. An off-current deviation of the TFT Tr is increased due to the pores such that the properties of the TFT Tr are un-uniformed.

A method of fabricating an array substrate to resolve these problems is introduced. FIGS. 4A to 4L are cross-sectional views of a fabricating process of an array substrate according to a first embodiment of the present invention. For convenience of explanation, a switching region is defined in a pixel region.

Figure 4A:
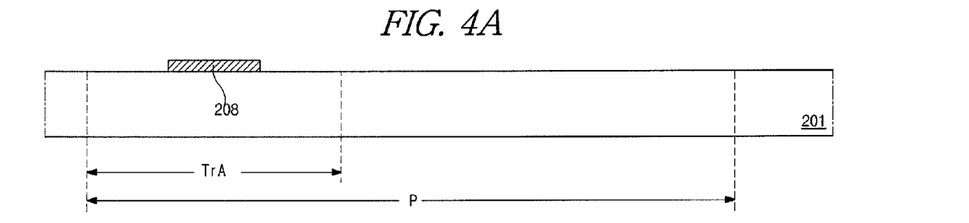
FIGS. 4A to 4L are cross-sectional views of a fabricating process of an array substrate according to a first embodiment of the present invention.

As shown in FIG. 4A, a first metal layer (not shown) is formed on a substrate 101 by depositing a first metallic material. For example, the first metallic material may include one of aluminum (Al), Al alloy (AlNd), copper (Cu), Cu alloy and chromium (Cr). The first metal layer is patterned by a first mask process to form a gate line (not shown) and a gate electrode 208 connected to the gate line. The mask process includes a step of forming a photoresist (PR) layer on the first metal layer, a step of exposing the PR layer using an exposing mask, a step of developing the exposed PR layer to form a PR pattern, a step of etching the first metal layer using the PR pattern as an etching mask and a step of stripping the PR pattern.

FIG. 4A shows the first metal layer having a single-layered structure. Alternatively, the first metal layer may have at least double-layered structure by sequentially depositing at least two of the first metallic material. In this case, each of the gate line and the gate electrode 108 has at least double-layered structure.

Figure 4B:
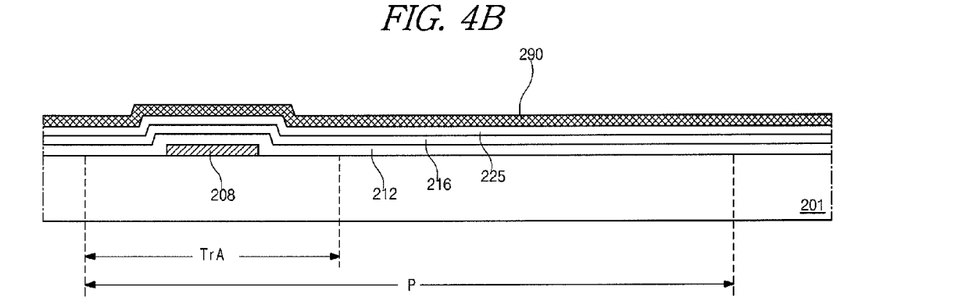

Next, as shown in FIG. 4B, a gate insulating layer 212 is formed on the gate line and the gate electrode 108 by depositing an inorganic insulating material. For example, the inorganic insulating material may include silicon oxide or silicon nitride.

Sequentially, an intrinsic amorphous silicon layer 216, an inorganic insulating material layer 225 and a heat transfer layer 290 are formed on the gate insulating layer 212 by sequentially depositing intrinsic amorphous silicon, an inorganic insulating material and a second metallic material. For example, the inorganic insulating material for the inorganic insulating layer 225 may include silicon oxide or silicon nitride. For example, the second metallic material may include Cr, Cr alloy, titanium (Ti) and Ti alloy. The second metallic material has an excellent property for convert an optical energy of a laser beam into a thermal energy.

Figure 4C:
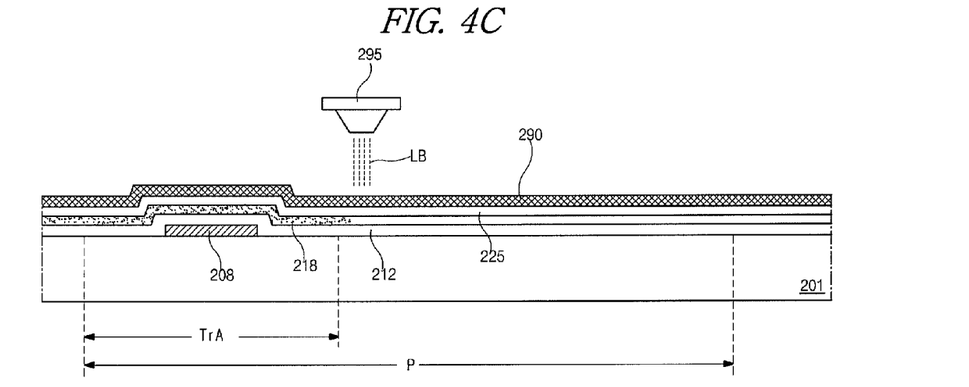

Next, as shown in FIG. 4C, a laser beam LB is irradiated onto the heat transfer layer 290 using a laser beam irradiation apparatus 295 to micro-crystallized the intrinsic amorphous silicon layer 216 (of FIG. 4B). As a result, a polycrystalline silicon layer 2118 is formed from the intrinsic amorphous silicon layer 216. The laser beam irradiation apparatus 295 uses a solid phase material as a laser beam source for generating the laser beam. For example, the laser beam irradiation apparatus 295 is a diode pumped solid state (DPSS) laser beam irradiation apparatus. With compared to a laser beam irradiation apparatus using a gate phase material as a laser beam source, the laser beam irradiation apparatus 295 using a solid phase material as a laser beam source has smaller error range of an energy density in a unit area. Accordingly, there is an uniform crystallization with the laser beam irradiation apparatus 295 uses a solid phase material as a laser beam source. The laser beam LB has a wavelength of about 700 to 1300 nm. An energy of the laser beam LB irradiated onto the heat transfer layer 290 is converted into a thermal energy. The thermal energy is uniformly transferred onto the intrinsic amorphous silicon layer 216 through the inorganic insulating material layer 225 such that the polycrystalline silicon layer 218 is formed.

Figure 4D:
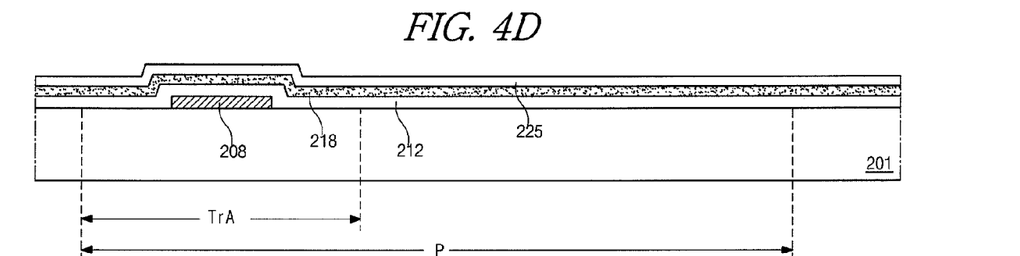

Next, as shown in FIG. 4D, the heat transfer layer 290 (of FIG. 4C) is etched such that the inorganic insulating material layer 225 is exposed.

Figure 4E:
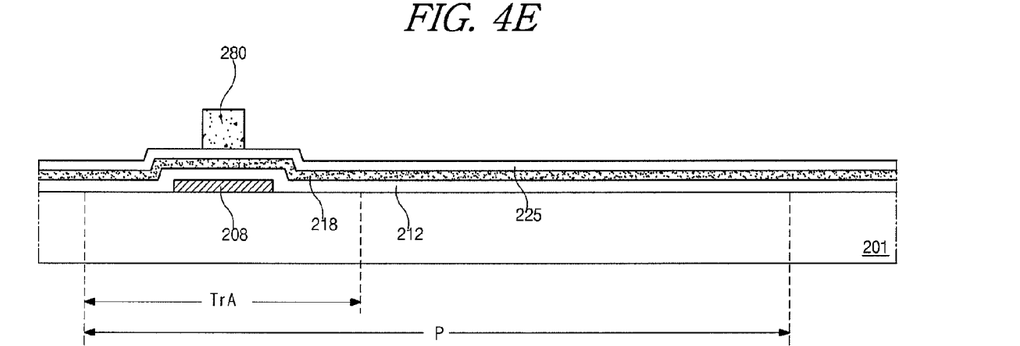

Next, as shown in FIG. 4E, a first PR pattern 280 is formed on the inorganic insulating material layer 225 (of FIG. 4D). The first PR pattern 280 corresponds to a center of the switching region TrA.

Figure 4F:
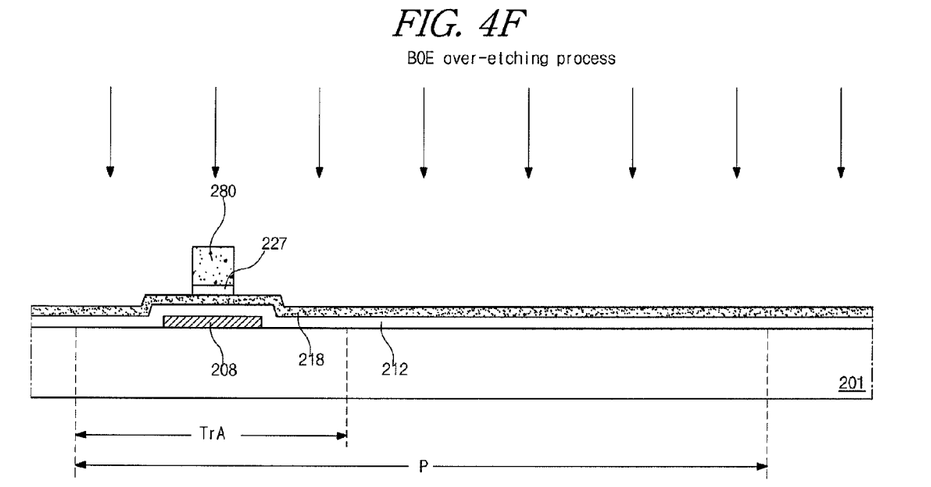

Next, as shown in FIG. 4F, an etching process using a buffered oxide etchant (BOE) is performed t etch the inorganic insulating material layer 225 using the first PR pattern 280 as an etching mask process. The etching process using the BOE is referred to as a BOE over-etching process. As a result, an etch-stopper 227 is formed under the first PR pattern 280. The etch-stopper 227 corresponds to the gate electrode 208. Namely, the inorganic insulating material layer 225 is patterned by a second mask process to form the etch-stopper 227 and to expose the polycrystalline silicon layer 218. The first PR pattern 280 is removed.

In more detail, the etching process using the BOE is performed by a longer time than a time minimally required for completely removing the inorganic insulating material 225. If the inorganic insulating material layer 225 is just removed and the polycrystalline silicon layer 218 is just exposed by an etching process using a BOE for a first process time, the etching process using the BOE in the present invention is performed for a second process time longer than the first process time. Namely, the inorganic insulating material 225 is over-etched using the BOE. Since the polycrystalline silicon layer 218 is exposed to air when the inorganic insulating layer 225 is etched, an oxidation layer (not shown) is simultaneously formed on the polycrystalline silicon layer 218. The oxidation layer is removed by the BOE over-etching process. If an ohmic contact layer 231 (of FIG. 4M) is formed on the active layer 220 (of FIG. 4M) without removing the oxidation layer, an ohmic contact property is degraded by the oxidation layer such that properties of the TFT Tr is also degraded. In addition, impurity-doped amorphous silicon is deposited without removing the oxidation layer, micro bubbles are generated on a surface of the active layer 120. This problem may be referred to as a micro peeling problem. Accordingly, the BOE cleaning process for removing the oxidation layer is performed.

Since the gate insulating layer 212 is covered with the polycrystalline silicon layer 218, diffusion of the BOE into the gate insulating layer 212 is prevented. Accordingly, different than the first embodiment, pores are not generated in the gate insulating layer 212. There is no problem of increase of an off-current deviation in the TFT Tr. Namely, in the first embodiment, the gate insulating layer 112 is exposed to the BOE etching process for forming the etch-stopper 127 and the BOE cleaning process for removing the oxidation layer. However, in the second embodiment, the gate insulating layer 212 is only exposed to the BOE over-etching process with the polycrystalline silicon layer 218 covering the gate insulating layer 212. In addition, the gate insulating layer 212 is directly exposed to the BOE during a time for removing the oxidation layer, an exposure time to the BOE is reduced.

Figure 4G:
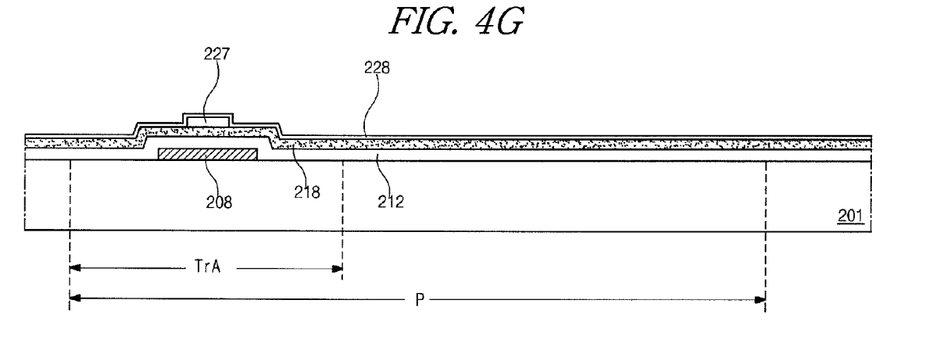

Next, as shown in FIG. 4G, the first PR pattern 280 (of FIG. 4F) is removed by stripping. Then, an impurity-doped amorphous silicon layer 228 is formed on the etch-stopper 227 and the polycrystalline silicon layer 218 by depositing impurity-doped amorphous silicon. Since the oxidation layer 220 is removed by the BOE cleaning process, the impurity-doped amorphous silicon layer 228 has ah ohmic contact with the polycrystalline silicon layer 218.

Figure 4H:
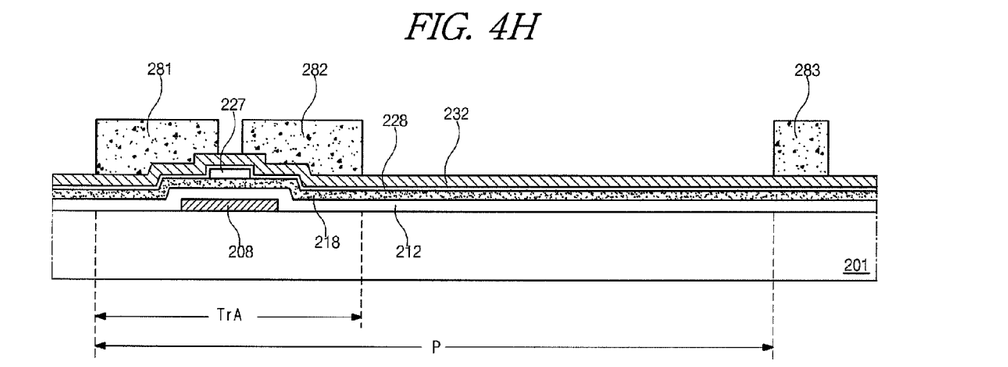

Next, as shown in FIG. 4H, a second metal layer 232 is formed on the impurity-doped amorphous silicon layer 228 by depositing a third metallic material. For example, the third metallic material may include one of molybdenum (Mo), Mo—Ti alloy (MoTi), Al, Al alloy (AlNd), Cu and Cu alloy. A PR layer (not shown) is formed on the second metal layer 232. The PR layer is exposed and developed to form second to fourth PR patterns 281, 282 and 283 on the second metal layer 232. The second PR pattern 281 is posited at one side of the etch-stopper 227, and the third PR pattern 282 is disposed at the other one side of the etch-stopper 227. The third PR pattern 282 is spaced apart from the second PR pattern 281.

The fourth PR pattern 283 is disposed at one edge of the pixel region P. The fourth PR pattern 283 extends from the second PR pattern 281.

Figure 4I:
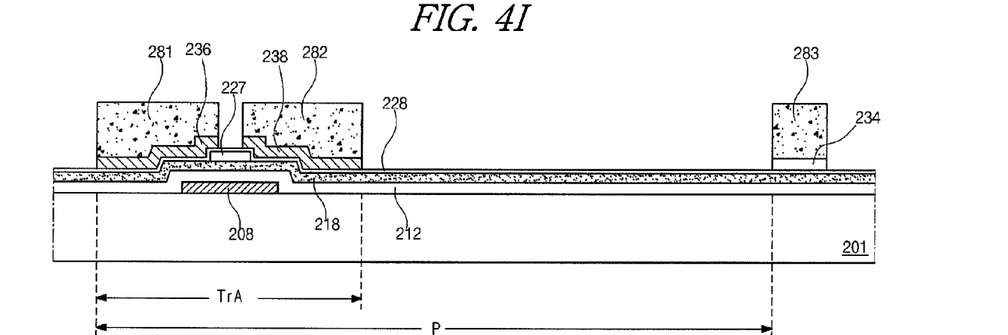

Next, as shown in FIG. 4I, the second metal layer 232 (of FIG. 4H) is etched using the second to fourth PR patterns 281, 282 and 283 to form a source electrode 236 under the second PR pattern 281, a drain electrode 238 under the third PR pattern 282 and a data line 234 under the fourth PR pattern 283 and to expose the impurity-doped amorphous silicon layer 228. The drain electrode 238 is spaced apart from the source electrode 236 such that a portion of the impurity-doped amorphous silicon layer 228 is exposed through a space between the source and drain electrodes 236 and 238, and the data line 234 extends from the source electrode 236. An end of the source electrode 236 and an end of the drain electrode 238 respectively overlaps the etch-stopper 227. Namely, the data line 234 is connected to the source electrode 236. The data line 234 crosses the gate line (not shown) to define the pixel region P.

Figure 4J:
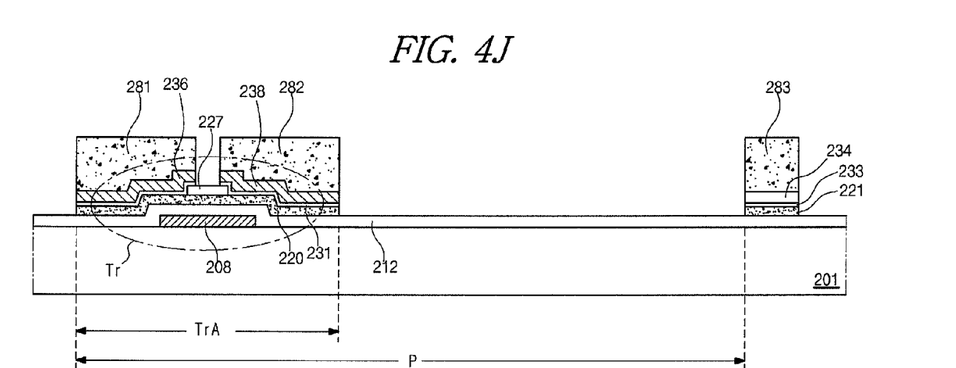

Next, as shown in FIG. 4J, the exposed portions of the impurity-doped amorphous silicon layer 228 (of FIG. 4I) and the polycrystalline silicon layer 218 (of FIG. 4I) are removed by a dry-etching. Namely, the exposed portion of impurity-doped amorphous silicon layer 228 through the space between the source and drain electrodes 236 and 238 is removed such that the etch-stopper 227 is exposed through the space between the source and drain electrodes 236 and 238. An ohmic contact layer 231 of impurity-doped amorphous silicon is formed under the source and drain electrodes 236 and 238, and an active layer 220 of polycrystalline silicon is formed under the ohmic contact layer 231 and the etch-stopper 217. The ohmic contact layer 231 has the same shape in a plane view as the source and drain electrodes 236 and 238. In addition, a first dummy pattern 221 form the polycrystalline silicon layer 218 and a second dummy pattern 233 from the impurity-doped amorphous silicon layer 228 is formed under the data line 234.

Since a portion of the polycrystalline silicon layer 218 is covered with the etch-stopper 217, the polycrystalline silicon layer 218 under the etch-stopper 217 is not etched during the dry-etching process for etching the impurity-doped amorphous silicon layer 228 and the polycrystalline silicon layer 218. Accordingly, there is no a thickness difference in the active layer 220.

Referring to FIGS. 4G to 4J, the source electrode 236, the drain electrode 238, the data line 234, the ohmic contact layer 231 and the active layer 220 are formed by a third mask process. The gate electrode 208, the gate insulating layer 212, the active layer 220 of polycrystalline silicon, the etch-stopper 227, the ohmic contact layer 231 of impurity-doped amorphous silicon, the source electrode 236, the drain electrode 238 constitute a TFT Tr.

Figure 4K:
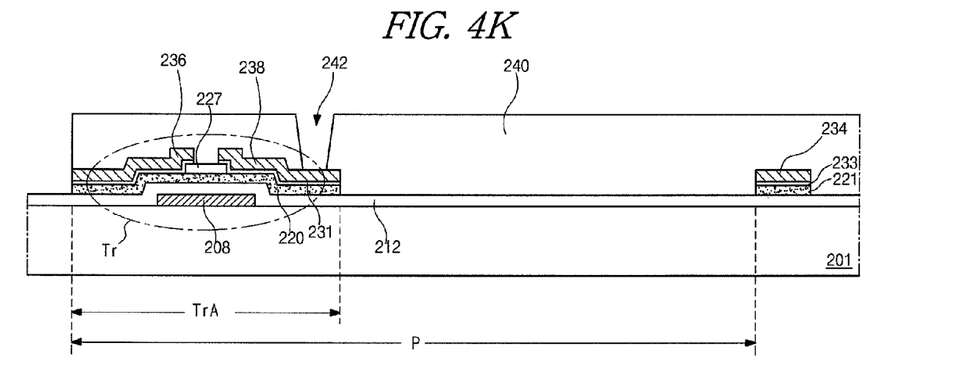

Next, as shown in FIG. 4K, the second to fourth PR patterns 281, 282 and 283 are removed by a stripping process. Then, a passivation layer 240 is formed on the TFT Tr, the data line 234 and the gate insulating layer 212 by coating an organic insulating material or depositing an inorganic insulating material. For example, the organic insulating material may include benzocyclobutene (BCB) or photo-acryl, and the inorganic insulating material may include silicon oxide or silicon nitride. FIG. 4K shows the passivation layer 240 formed of the organic insulating material. As a result, the passivation layer 240 has a flat top surface. The passivation layer 240 is patterned by a fourth mask process to form a drain contact hole 242. A portion of the drain electrode 238 is exposed through a portion of the drain contact hole 242.

Figure 4L:
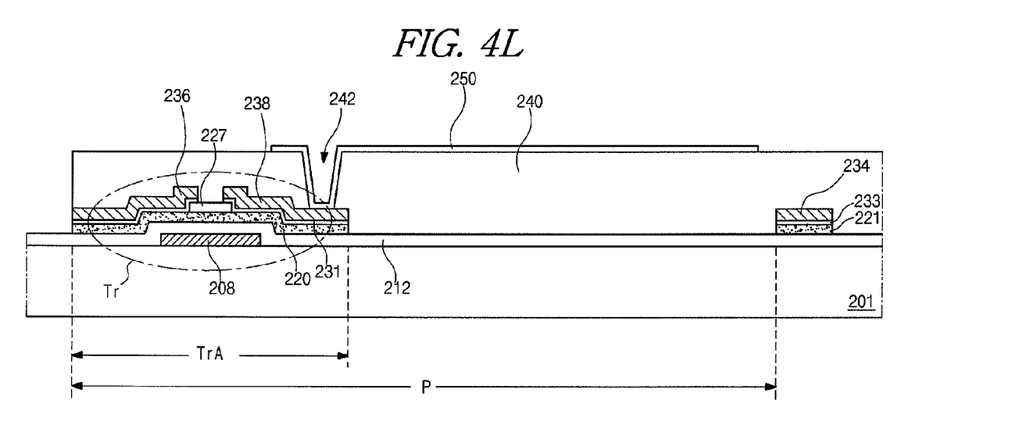

Next, as shown in FIG. 4L, a transparent conductive material layer (not shown) is formed on the passivation layer 240 by depositing a transparent conductive material. For example, the transparent conductive material may include indium-tin-oxide (ITO) or indium-zinc-oxide (IZO). The transparent conductive material layer is patterned by a fifth mask process to form a pixel electrode 250 in the pixel region P. The pixel electrode 250 is disposed on the passivation layer 240 and is connected to the drain electrode 238 through the drain contact hole 242. By the above process, the array substrate according to the second embodiment of the present invention is obtained.

In the second embodiment, the array substrate is fabricated by a five mask process. Accordingly, there is advantages in production costs and production yield with compared to the first embodiment. In addition, since the gate insulating layer 212 is covered with the polycrystalline silicon layer 218 during the BOE over-etching process for forming the etch-stopper 217 and removing the oxidation layer, diffusion of the BOE into the gate insulating layer 212 is prevented. Accordingly, different than the first embodiment, pores are not generated in the gate insulating layer 212. There is no problem of increase of an off-current deviation in the TFT Tr.

In the embodiments of the present invention, since the active layer of the TFT is formed of polycrystalline silicon, properties of the TFT are improved. In addition, since a fabricating method of the present invention does not require a doping process, production costs do not increase and production yield is improved. Furthermore, since the active layer is protected by the etch-stopper, the active layer has a uniform thickness.

Moreover, since an exposure of the gate insulating layer to a BOE cleaning process is minimized, there is no pore in the gate insulating layer adjacent to the gate electrode. Accordingly, the degradation of properties of the TFT by the BOE etching process is not generated.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate, comprising:
    forming a gate line and a gate electrode connected to the gate line;
    sequentially forming a gate insulating layer, an intrinsic amorphous silicon layer, an inorganic material insulating layer and a heat transfer layer on the gate line and the gate electrode;
    irradiating a laser beam onto the heat transfer layer to crystallize the intrinsic amorphous silicon layer into a polycrystalline silicon layer;
    removing the heat transfer layer;
    patterning the inorganic insulating material layer using a buffered oxide etchant to form an etch-stopper corresponding to the gate electrode, wherein a first process time for the step of patterning the inorganic insulating material layer is longer than a second process time minimally required for completely removing the inorganic insulating material layer;
    sequentially forming an impurity-doped amorphous silicon layer and a metal layer on the etch-stopper and the polycrystalline silicon layer;
    patterning the metal layer to form a data line, a source electrode and a drain electrode, the impurity-doped amorphous silicon layer to form an ohmic contact layer, and the polycrystalline silicon layer to form an active layer, the data line crossing the gate line and connected to the source electrode, the drain electrode spaced apart from the source electrode, an end of the source electrode and an end of the drain electrode overlapping the etch-stopper, the ohmic contact layer disposed under the source electrode and the drain electrode, and the active layer disposed under the ohmic contact layer and the etch-stopper;

forming a passivation layer on the data line, the source electrode and the drain electrode and including a drain contact hole exposing a portion of the drain electrode; and forming a pixel electrode on the passivation layer and contacting the portion of the drain electrode through the drain contact hole.

2. The method according to claim 1, wherein each of the gate insulating layer and the inorganic insulating material layer is formed of an inorganic insulating material.

3. The method according to claim 1, wherein each of the gate insulating layer and the inorganic insulating material layer is formed of silicon oxide.

4. The method according to claim 1, wherein the laser beam is generated by using a solid phase material as a laser beam source.

5. The method according to claim 1, wherein the energy of the laser beam is converted into a thermal energy by the heat transfer layer, and the thermal energy is transferred onto the intrinsic amorphous silicon layer through the inorganic insulating material layer.

6. The method according to claim 5, wherein the heat transfer layer is formed of one of chromium, chromium alloy, titanium and titanium alloy.

7. The method according to claim 1, wherein an oxidation layer, which is spontaneously formed on the polycrystalline silicon layer by exposing to an air after the inorganic insulating material layer is etched, is removed by the step of the patterning the inorganic insulating material layer.

8. The method according to claim 1, wherein an entire surface of the gate insulating layer is covered with the polycrystalline silicon layer during the step of etching the inorganic insulating material layer.

9. The method according to claim 1, wherein the step of patterning the metal layer, the impurity-doped amorphous silicon layer, and the polycrystalline silicon layer includes:

forming first, second and third photoresist (PR) patterns on the metal layer, the first PR pattern corresponding to the source electrode, the second PR pattern corresponding to the drain electrode, and the third PR pattern corresponding to the data line;

etching the metal layer using the first, second and third PR patterns to form the data line, the source electrode and the drain electrode and to expose portions of the impurity-doped amorphous silicon layer;

etching the exposed portions of the impurity-doped amorphous silicon layer and the polycrystalline silicon layer to form the ohmic contact layer and the active layer; and removing the first, second and third PR patterns.

* * * * *